US012635107B2

(12) United States Patent
Wu et al.

(10) Patent No.: US 12,635,107 B2
(45) Date of Patent: May 19, 2026

(54) FAN SPEED CONTROL METHOD

(71) Applicants: INVENTEC (PUDONG) TECHNOLOGY CORPORATION, Shanghai (CN); INVENTEC CORPORATION, Taipei City (TW)

(72) Inventors: Guoping Wu, Shanghai (CN); Lian-Fei Zhang, Shanghai (CN)

(73) Assignees: INVENTEC (PUDONG) TECHNOLOGY CORPORATION, Shanghai (CN); INVENTEC CORPORATION, Taipei City (TW)

( * ) Notice: Subject to any disclaimer, the term of this patent is extended or adjusted under 35 U.S.C. 154(b) by 405 days.

(21) Appl. No.: 18/545,823

(22) Filed: Dec. 19, 2023

(65) Prior Publication Data

US 2025/0169026 A1 May 22, 2025

(30) Foreign Application Priority Data

Nov. 21, 2023 (CN) .......................... 202311561531.3

(51) Int. Cl.
H05K 7/20 (2006.01)

(52) U.S. Cl.
CPC ..... H05K 7/20209 (2013.01); H05K 7/20136 (2013.01); H05K 7/20836 (2013.01)

(58) Field of Classification Search
CPC ........... H05K 7/20209; H05K 7/20136; H05K 7/20836; H05K 7/20718; F04D 27/00; F04D 27/004
See application file for complete search history.

(56) References Cited

U.S. PATENT DOCUMENTS

| | | | | |
|---|---|---|---|---|
| 10,571,979 | B2 * | 2/2020 | Woo | G06F 1/206 |
| 2016/0239067 | A1 * | 8/2016 | Lovicott | G06F 1/206 |
| 2018/0267566 | A1 * | 9/2018 | Locke | G05D 23/1919 |
| 2022/0147125 | A1 * | 5/2022 | Huai | F04D 29/582 |
| 2023/0221779 | A1 * | 7/2023 | Adams | G06F 1/206 |
| | | | | 700/300 |

* cited by examiner

*Primary Examiner* — Mong-Shune Chung

(74) *Attorney, Agent, or Firm* — Maschoff Brennan

(57) ABSTRACT

A fan speed control method performing by a baseboard management controller includes following steps: obtaining a first temperature from a first temperature sensor, determining a first rotational speed according to the first temperature and a proportional-integral-derivative (PID) equation, wherein a proportional term of the PID equation is:

$$\int_0^t f(EV(t), p) [EV'(t)]^2 dt - \int_0^{t-\Delta t} f(EV(t-\Delta t), p) [EV'(t-\Delta t)]^2 dt;$$

where t denotes time, $\Delta t$ denotes an interval time, $EV(t)$ denotes an error between the first temperature and a set temperature when the time is t, $EV'(t)$ denotes a first derivative of $EV(t)$, $f(EV(t),p)$ denotes a coefficient of the proportional term, and controlling said at least one fan according to said at least the first rotational speed.

10 Claims, 3 Drawing Sheets

T1 — Obtaining at least one first temperature from at least one first temperature sensor T2 — Determining a first rotational speed according to the at least one first temperature and a PID formula T3 — Controlling at least one fan at least according to the first rotational speed

FAN SPEED CONTROL METHOD

CROSS-REFERENCE TO RELATED APPLICATIONS

This non-provisional application claims priority under 35 U.S.C. § 119(a) on Patent Application No(s). 202311561531.3 filed in China on Nov. 21, 2023, the entire contents of which are hereby incorporated by reference.

BACKGROUND

1. Technical Field

The present disclosure relates to servers and air-cooling systems, particularly a fan speed control method.

2. Related Art

The air-cooling system of a server is configured to control the temperature of the server. Typically, an air-cooling system consists of fans and radiators. Fans blow air into the server, and it passes through radiators to cool down, thereby reducing the temperature of the server.

In order to rationally adjust the power consumption of the server during operation and effectively control the volume of noise, a proportional-integral-derivative (PID) control method is commonly adopted. By monitoring the current temperature of components inside the server or the values of temperature sensors on the baseboard, the fan speed is dynamically adjusted in real-time. This helps in cooling the heat-generating components inside the server.

However, as the power consumption of server components continues to increase, the rate of temperature rise of the components also gradually accelerates. In response to the high temperatures generated by components under such abnormal states, a higher fan speed is usually set for the air-cooling system to control the temperature of components in the system. However, abruptly increasing the fan speed can lead to unstable speed control of the air-cooling system, and stabilizing it again may consume a considerable amount of time.

SUMMARY

In view of the above, the present disclosure proposes a fan speed control method, which is a rapid response mechanism to handle the high temperatures generated by components inside the server.

According to one or more embodiment of the present disclosure, a fan speed control method is performed by a baseboard management controller. The fan speed control method includes following steps: obtaining at least one first temperature from at least one first temperature sensor; determining a first rotational speed according to the at least one first temperature and a proportional-integral-derivative (PID) formula, wherein a proportional term is:

$$\int_0^t f(EV(t), p) [EV'(t)]^2 dt - \int_0^{t-\Delta t} f(EV(t-\Delta t), p) [EV'(t-\Delta t)]^2 dt;$$

where t represents time, $\Delta t$ represents a time interval, EV(t) represents an error between the at least one first temperature and a set temperature at time t, EV'(t) represents a first derivative of EV(t), and $f(EV(t),p)$ represents a coefficient of the proportional term; and controlling at least one fan according to the first rotational speed.

The aforementioned context of the present disclosure and the detailed description given herein below are used to demonstrate and explain the concept and the spirit of the present application and provides the further explanation of the claim of the present application.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

The present disclosure proposes

Figure 1:
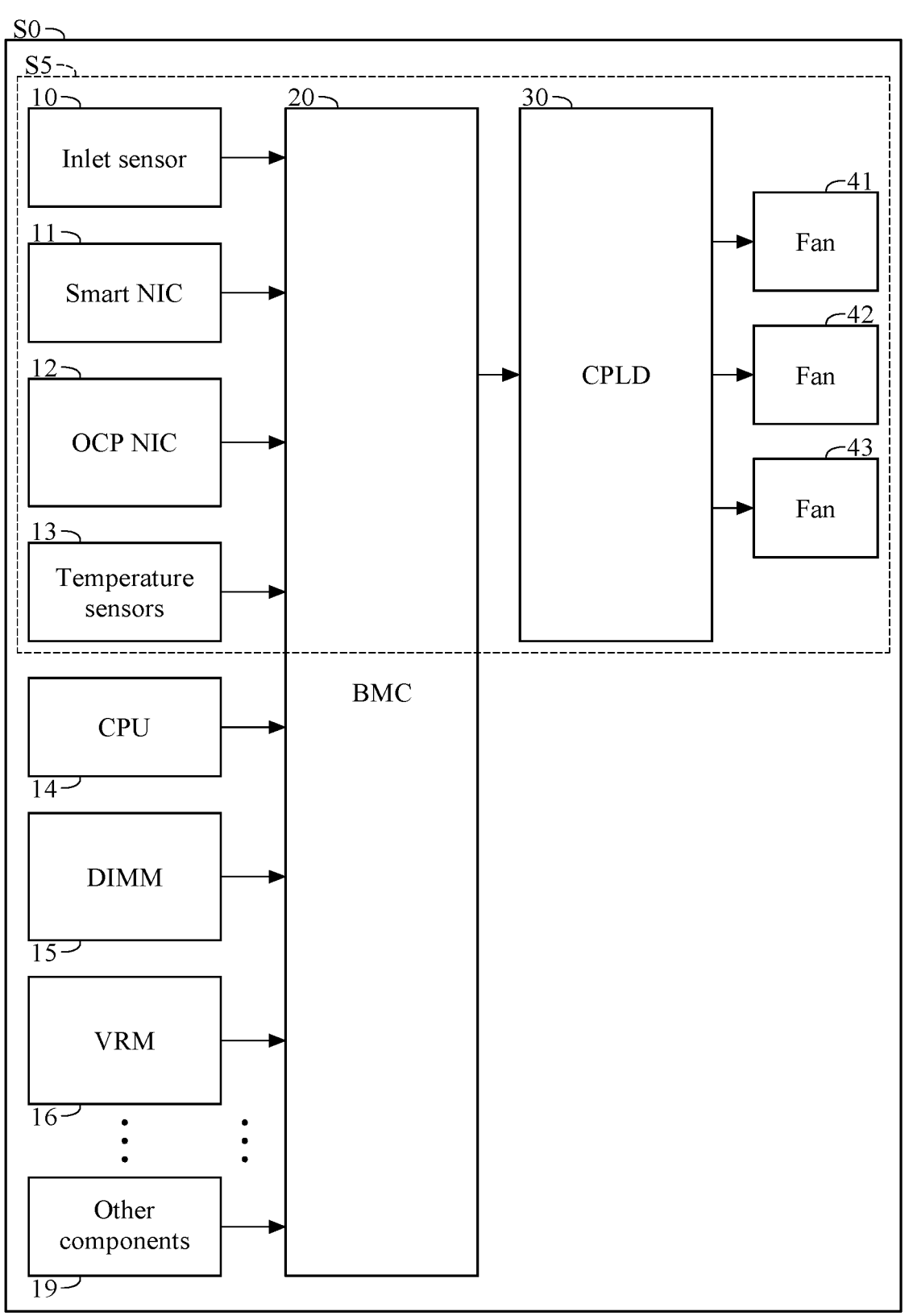
FIG. 1 is a block diagram of an air-cooling system applicable to a fan speed control method of an embodiment of the present disclosure.

Please refer to FIG. 1. FIG. 1 is a block diagram of an air-cooling system applicable to a fan speed control method of an embodiment of the present disclosure. As shown in FIG. 1, the server includes the following components: an inlet sensor 10, a Smart Network Interface Card (Smart NIC) 11, an Open Compute Project NIC (OCP NIC), a plurality of temperature sensors 13 disposed on a baseboard, a Central Processing Unit (CPU) 14, a Dual In-line Memory Module (DIMM) 15, a Voltage Regulator Module (VRM) 16, other components 19 required for the server, a Baseboard Management Controller (BMC) 20, a Complex Programmable Logic Device (CPLD) 30, fans 41, 42, and 43. Other components 19 required for the server may include a graphics card, power supply components, and so on. The present disclosure does not limit the number and type of other components 19.

The state when the server is powered off is referred to as the S5 state. In S5 state, components that need fan speed control include the inlet sensor 10, Smart NIC 11, OCP NIC 12, and the plurality of temperature sensors 13 disposed on the baseboard, as indicated by the dashed box S5 in FIG. 1. The state when the server is powered on is referred to as the S0 state. In S0 state, all components shown in FIG. 1 can undergo fan speed control.

Figure 2:
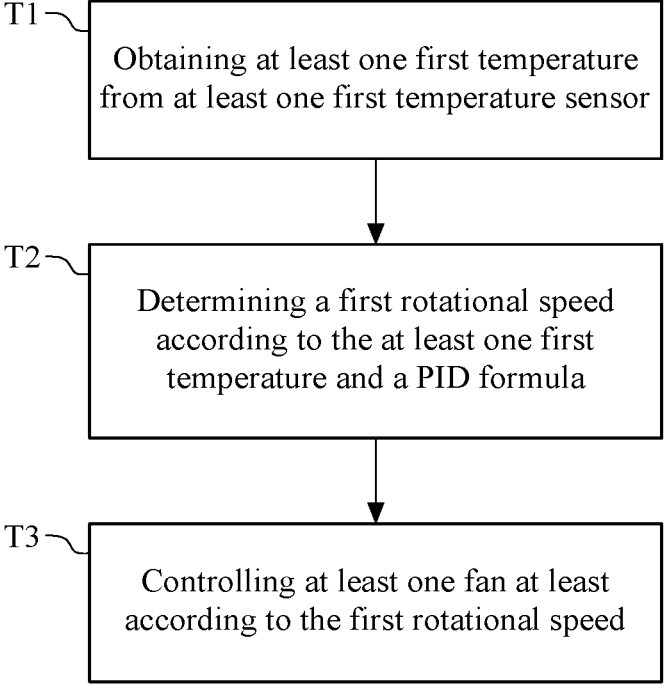
FIG. 2 is a flowchart illustrating the fan speed control method according to an embodiment of the present disclosure.

Please refer to both FIG. 1 and FIG. 2. FIG. 2 is a flowchart illustrating the fan speed control method according to an embodiment of the present disclosure. The method shown in FIG. 2 is applicable to, but not limited to, the server illustrated in FIG. 1. The operation of the components in the server shown in FIG. 1 is exemplarily explained to illustrate the method shown in FIG. 2. Steps T1 to T3 of FIG. 2 can be executed by the BMC 20 shown in FIG. 1

In step T1, the BMC 20 obtains at least one first temperature from at least one first temperature sensor.

The at least one first temperature sensor includes the plurality of temperature sensors 13 set on the Smart NIC 11, OCP NIC 12, and baseboard.

In step T2, when the BMC 20 is in a normal operation state, the BMC 20 determines a first rotational speed according to the at least one first temperature and a proportional-integral-derivative (PID) formula. The proportional term of the PID formula is as follows:

$$\int_0^t f(EV(t),\, p)\,[EV'(t)]^2 dt -$$

$$\int_0^{t-\Delta t} f(EV(t-\Delta t),\, p)\,[EV'(t-\Delta t)]^2 dt$$

(Equation 1)

where t represents time, $\Delta t$ represents a time interval, EV(t) represents an error between the at least one first temperature and a set temperature at time t, EV'(t) represents a first derivative of EV(t), and $f$(EV(t),p) represents a coefficient of the proportional term.

In step T3, the BMC 20 controls at least one of fans 41, 42, 43 at least according to the first rotational speed.

Generally, the mathematical model for PID control is given by Equation 2:

$$PWM(t) = k_p EV(t) + k_i \int_0^t EV(t)dt + k_d \frac{dEV(t)}{dt}$$

(Equation 2)

where PWM(t) represents the output of the controller (also known as the actuator); EV(t) represents the input to the controller, typically the difference between the current temperature and the set temperature (i.e., EV(t) =PV(t)–SV(t), where PV(t) is the current temperature, and SV(t) is the set temperature); $k_p$ represents the proportional gain of the controller; $k_i$ represents the integral time of the controller; and $k_d$ represents the derivative time of the controller.

Discretizing the Equation 2 yields the PWM expression for fans 41, 42, and 43 at time t, as shown in Equation 3.

$$PWM(t) = k_p EV(t) + k_i \sum_0^t EV(t) + k_d \frac{EV(t) - EV(t-\Delta t)}{\Delta t}$$

(Equation 3)

the PWM expression for fans 41, 42, and 43 is obtained by stepping back in time by $\Delta t$ according to the Equation 3, as shown in Equation 4 below.

$$PWM(t - \Delta t) =$$

$$k_p EV(t-\Delta t) + k_i \sum_0^{t-\Delta t} EV(t) + k_d \frac{EV(t-\Delta t) - EV(t-2\Delta t)}{\Delta t}$$

(Equation 4)

Combining Equations 3 and 4 results in the standard PWM expression for fans 41, 42, and 43, as shown in Equation 5 below:

$$\Delta PWM(t) =$$

(Equation 5)

$$PWM(t) - PWM(t - \Delta t) = k_p[EV(t) - EV(t-\Delta t)] +$$

$$k_i EV(t) + k_d[EV(t) + EV(t - 2\Delta t) - 2EV(t - \Delta t)]$$

In Equation 5, the proportional term is $k_p$[EV(t)–EV(t–$\Delta t$)], the integral term is $k_i$EV(t), and the derivative term is $k_d$[EV(t)+EV(t–2$\Delta t$)–2EV(t–$\Delta t$)].

In order to uniformly correct the introduced values for different PID parameters, the present disclosure introduces a correction function definition $f$(EV,$\tau$) for different temperature difference intervals, as shown in Equation 6:

$$f(EV,\, \tau) = \begin{cases} 0 & EV < -10 \\ k_\tau & -10 \leq EV < 5 \\ k_\tau' & 5 \leq EV < 10 \\ 0 & 10 < EV \end{cases}$$

(Equation 6)

In the setting of Equation 6, when the temperature difference range of EV is below $-10°$ C. or above $10°$ C., PID control is suppressed. The purpose is to eliminate the interference of the actual temperature range that does not participate in the control on the output of fan PWM for each component.

$\tau$ in Equation 6 can be replaced by p, i, or d, and satisfies the following Equation 7:

$$\begin{cases} k_p' = 20 \\ k_i' = 0 \\ k_d' = 0 \end{cases}$$

(Equation 7)

Additionally, $k_p$, $k_i$, and $k_d$ are respective parameter values for P, I, and D in the PID function. Generally, $k_p$ ranges from 2 to 5, $k_i$ ranges from 0.2 to 1, and $k_d$ ranges from 0 to 1.

The core content of the present disclosure is to perform integration processing on the proportional term of PWM concerning temperature and then discretize with respect to time parameters. The benefit of this approach is the ability to control the rise and fall of fan speed strongly through the proportional term in PID. The updated proportional term function is calculated as follows in Equation 8:

$$F(EV,\, p) =$$

(Equation 8)

$$\int_{EV(t-\Delta t)}^{EV(t)} f(EV,\, p)dEV = \int_0^t f(EV(t),\, p)\,[EV'(t)]^2 dt -$$

$$\int_0^{t-\Delta t} f(EV(t-\Delta t),\, p)\,[EV'(t-\Delta t)]^2 dt$$

The updated integral term function is calculated as follows in Equation 9, where $f$(EV,i) represents the integral term coefficient.

$$f(EV,\, i) \times EV(t)$$

(Equation 9)

The updated derivative term function is calculated as follows in Equation 10, where $f$(EV,d) represents the derivative term coefficient.

$$f(EV, d) \times [EV(t) + EV(t - 2\Delta t) - 2EV(t - \Delta t)] \qquad \text{(Equation 10)}$$

The following example illustrates the effect of the updated proportional term function:

When EV<−10, no additional speed control is needed because the current component's temperature has a large margin from the set temperature When −10≤EV<5, the PID speed control of the component will take effect, similar to the existing PID speed control When 5≤EV<10, there are several scenarios to consider:

Scenario 1: Last second EV=3, entering with PWM value P1, the next second EV=8. The fan speed will climb to P1+Ki×2+(8−5)×20=P1+2Ki+60.

Scenario 2: Last second EV=3, entering with PWM value P1, the next second EV=12. The fan speed will rise to P1+Ki×2+(10−5)×20=P1+2Ki+100. Since the maximum fan speed is 100%, the final output fan PWM is 100%.

Scenario 3: Last second EV=3, entering with PWM value P1, the next second EV=12. The fan speed will rise to P1+Ki×2+(10−5)×20+(12-10)×0=P1+2Ki+100. The final output fan PWM is 100%, but this part can be recorded Scenario 4: based on scenario 3, if EV falls back to 3, the fan PWM will stabilize and drop to P1 to prevent the fan speed from being uncontrollable due to the inability to immediately respond or insufficient response of the fan PWM under speed adjustments.

Figure 3:
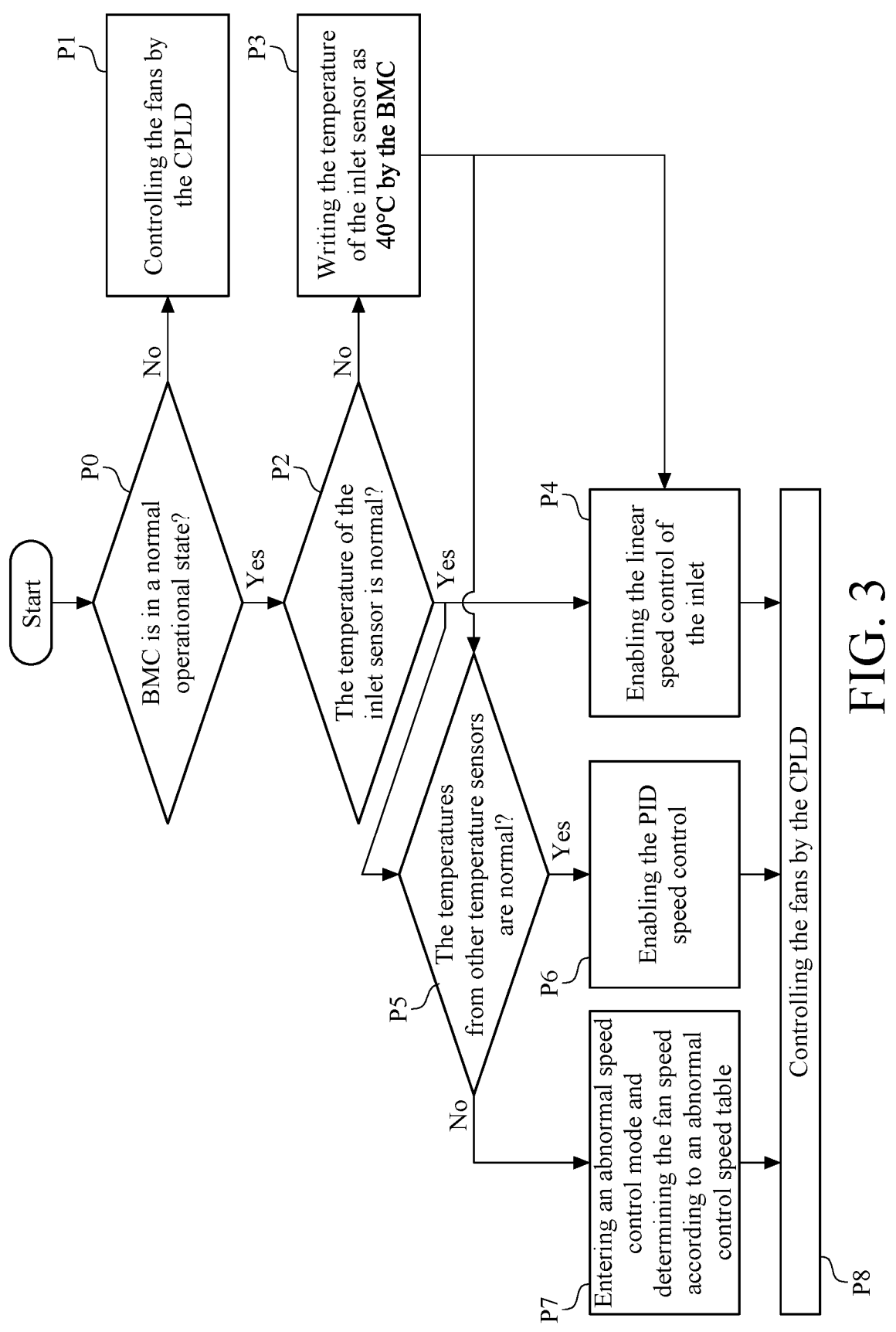
FIG. 3 is a flowchart illustrating the fan speed control method according to another embodiment of the present disclosure.

Please refer to both FIG. 1 and FIG. 3. FIG. 3 is a flowchart illustrating the fan speed control method according to another embodiment of the present disclosure. The method shown in FIG. 3 is applicable to, but not limited to, the server shown in FIG. 1. The operation of the components of the server, as shown in FIG. 1, is exemplarily explained to illustrate the method shown in FIG. 3. The steps P0, P2 to P7 shown in FIG. 3 can be performed by the BMC 20 shown in FIG. 1.

In step P0, it is determined whether the BMC 20 is in a normal operational state. If the determination is false, the process proceeds to step P1; if the determination is true, the process proceeds to step P2.

In step P1, the CPLD 30 controls the fans 41, 42, and 43 when the BMC 20 is not in the normal operational state.

In step P2, the BMC 20 obtains the sensed temperature from the inlet sensor 10 and determines whether the temperature of the inlet sensor 10 is normal (whether it falls within the first default normal temperature range). If the determination is false (not within the first default normal temperature range), the process proceeds to step P3; if the determination is true (within the first default normal temperature range), the process proceeds to steps P4 and P5.

In step P3, if the BMC 20 determines that the temperature of the inlet sensor 10 abnormally increases, the BMC 20 writes the temperature of the inlet sensor 10 as 40° C. to participate in the subsequent control logic for the inlet. This involves continuing to step P4. After completing step P3, the process also proceeds to step P5.

In step P4, the BMC 20 enables the linear speed control of the inlet. Specifically, the sensed temperature obtained from the inlet sensor 10 is referred to as the second temperature. The BMC 20 determines the second speed according to the second temperature and a default ratio, determines the third speed according to the first speed and the second speed, and controls the fans 41, 42, and 43 with the third speed.

In step P5, the BMC 20 checks whether the temperatures from other temperature sensors 13 are normal (whether they fall within the second default normal temperature range). If the determination is true (within the second default normal temperature range), the process proceeds to step P6; if the determination is false (not within the second default normal temperature range), the process proceeds to step P7.

In step P6, if the temperatures of all components are normal, the PID speed control is enabled. The details of step P6 are as described in steps T1 to T3 of FIG. 2, and they are not repeated here.

In step P7, if the temperature from any sensor is abnormal, the system enters an abnormal speed control mode. The fan control speed is determined according to an abnormal control speed table.

In an embodiment, in order to ensure that all components do not have heating issues, an abnormal fan speed control table is established according to the inlet temperature. This abnormal control table corresponds to the lowest fan speed that can control all components to prevent heating issues under maximum pressure. For example, the absence of temperature readings for the CPU 14 does not mean that there are no heating issues with the CPU 14. To ensure that heating issues do not occur in such situations, the actual system's abnormal control table is used to adjust the system's fan speed and ensure proper heat dissipation.

As shown in FIG. 3, steps P4, P6, and P7 will all proceed to step P8. In step P8, the CPLD 30 controls the fans 41, 42, and 43. Specifically, the CPLD 30 calculates fan PWM weights for each pathway and selects the highest one to ensure effective heat dissipation for all components in the system. In other words, the temperatures of all components are aggregated to the BMC 20 and controlled through the CPLD 30 for all fans installed in the system. The system will ultimately be controlled with the maximum fan duty cycle to guarantee proper heat dissipation.

In other embodiments of the present disclosure, the fan speed control method may include only steps P2 to P6 in FIG. 3 (i.e., steps P0-P1, P7 to P8 may be implemented differently from the above); or only steps P5 to P7 in FIG. 3 (i.e., steps P0 to P4 and P8 may be implemented differently from the above); or steps P0, P1, and P6 (i.e., steps P2 to P5 and P7 to P8 may be implemented differently from the above).

In summary, the fan speed control method according to an embodiment of the present disclosure proposes a fast response mechanism to address the high temperature generated by components inside the server. The specific logic is as follows: when performing PID control on component temperature, the calculation mode of ΔPWM in the corresponding PID formula is modified. The main modification is to change the proportional term in the PID formula to the integral difference of a continuous function. When the temperature deviates from the default temperature range, it triggers an abnormal speed control interval. The adjustment level of the proportional term in this formula is as follows: for every 1° C. increase, the system fan PWM increases by 20%. The integral term and the derivative term are suppressed by their respective coefficient settings. When the components generate high temperatures, the system fan will quickly respond to 100% within a predetermined 5° C. to achieve emergency cooling. After the high-temperature phenomenon of the components is resolved, the system will return to the initial effective position of the integral term of the system fan speed introduced by the temperature regulation. This ensures that after the abnormal speed is resolved, the system can quickly return to normal speed.

What is claimed is:

1. A fan speed control method, performed by a baseboard management controller, comprising:

obtaining at least one first temperature from at least one first temperature sensor;

determining a first rotational speed according to the at least one first temperature and a proportional-integral-derivative (PID) formula, wherein a proportional term of the PID formula is:

$$\int_0^t f(EV(t),\, p)\, [EV'(t)]^2\, dt - \int_0^{t-\Delta t} f(EV(t-\Delta t),\, p)\, [EV'(t-\Delta t)]^2\, dt;$$

wherein t represents time, $\Delta t$ represents a time interval, $EV(t)$ represents an error between the at least one first temperature and a set temperature at time t, $EV'(t)$ represents a first derivative of $EV(t)$, and $f(EV(t),p)$ represents a coefficient of the proportional term; and controlling at least one fan according to the first rotational speed.

2. The fan speed control method of claim 1, wherein $f(EV(t),p)=0$ when $EV(t)<-10$;

a setting range of $f(EV(t),p)$ is 2 to 5 when $-10<EV(t)<5$;

$f(EV(t),p)=20$ when $5<EV(t)<10$; and $f(EV(t),p)=0$ when $10<EV(t)$.

3. The fan speed control method of claim 1, wherein an integral term of the PID formula is: $f(EV,i)\times EV(t)$;

a derivative term of the PID formula is: $f(EV,d)\times[EV(t)+EV(t-2\Delta t)-2EV(t-\Delta t)$; and $f(EV,i)$ and $f(EV,d)$ represent coefficients of the integral term and the derivative terms, respectively.

4. The fan speed control method of claim 1, further comprising:

obtaining a second temperature according to a sensed temperature of a second temperature sensor;

determining a second rotational speed according to the second temperature and a default ratio;

determining a third rotational speed according to the first rotational speed and the second rotational speed; and controlling the at least one fan using the third rotational speed.

5. The fan speed control method of claim 4, wherein obtaining the second temperature according to the sensed temperature of the second temperature sensor comprises:

determining whether the sensed temperature falls within a first default normal temperature range;

setting the second temperature to a default temperature when the sensed temperature does not fall within the first default normal temperature range; and using the sensed temperature as the second temperature when the sensed temperature falls within the first default normal temperature range.

6. The fan speed control method of claim 1, wherein determining the first rotational speed according to the at least one first temperature and the PID formula is performed when the at least one first temperature falls within a second default normal temperature range.

7. The fan speed control method of claim 6 further comprising: when the at least one first temperature does not fall within the second default normal temperature range, controlling the at least one fan according to an abnormal speed control table, wherein the abnormal speed control table includes a default minimum fan speed.

8. The fan speed control method of claim 1, wherein the at least one first temperature sensor includes a plurality of temperature sensors respectively positioned in a smart network card, an open computing project network card and a baseboard.

9. The fan speed control method of claim 1, wherein determining the first rotational speed according to the at least one first temperature and the PID formula is performed when the baseboard management controller is in a normal operational state.

10. The fan speed control method of claim 9, further comprising: when the baseboard management controller is not in a normal operational state, controlling the at least one fan by a complex programmable logic device.

* * * * *